United States Patent [19]

Nishimoto

[11] Patent Number: 5,017,514
[45] Date of Patent: May 21, 1991

[54] METHOD OF MANUFACTURING A SEMICONDUCTOR DEVICE USING A MAIN VERNIER PATTERN FORMED AT A RIGHT ANGLE TO A SUBSIDIARY VERNIER PATTERN

[75] Inventor: Shozo Nishimoto, Tokyo, Japan

[73] Assignee: NEC Corporation, Japan

[21] Appl. No.: 441,522

[22] Filed: Nov. 27, 1989

[30] Foreign Application Priority Data

Nov. 25, 1988 [JP] Japan .................................. 63-298606

[51] Int. Cl.⁵ ...................... H01L 21/00; H01L 21/02; H01L 21/30; H01L 21/66
[52] U.S. Cl. ......................................... 437/229; 437/8; 356/400; 356/401; 430/5; 430/311; 430/312
[58] Field of Search .................. 437/8, 229; 156/659.1, 156/660, 661.1; 148/DIG. 102; 430/5, 311, 312, 313, 314, 315; 250/491.1, 492.2; 356/123, 400, 401, 399

[56] References Cited

U.S. PATENT DOCUMENTS

| | | | |
|---|---|---|---|
| 4,405,238 | 9/1983 | Grobman et al. | 356/401 |
| 4,538,105 | 8/1985 | Ausschnitt | 437/8 |
| 4,547,446 | 10/1985 | Tam | 356/399 |
| 4,600,309 | 7/1986 | Fay | 356/401 |
| 4,606,643 | 8/1986 | Tam | 356/401 |
| 4,610,940 | 9/1986 | Araihara | 430/5 |
| 4,623,257 | 11/1986 | Feather | 356/400 |
| 4,626,907 | 12/1986 | Schedewie | 356/401 |
| 4,742,233 | 5/1988 | Kuyel | 250/291.1 |

FOREIGN PATENT DOCUMENTS

| | | |
|---|---|---|
| 0101710 | 6/1982 | Japan . |
| 0134826 | 8/1984 | Japan . |
| 0273724 | 11/1987 | Japan . |
| 0273725 | 11/1987 | Japan . |
| 0260045 | 10/1988 | Japan . |
| 2067282 | 7/1986 | United Kingdom ................ 356/401 |

Primary Examiner—Olik Chaudhuri
Assistant Examiner—B. Everhart
Attorney, Agent, or Firm—Laff, Whitesel, Conte & Saret

[57] ABSTRACT

A semiconductor device has a device section and a peripheral section outside the device section. A main vernier pattern is formed in the peripheral section for inspecting finely an alignment state in a first direction, and a subsidiary vernier pattern is formed in the peripheral section near the main vernier pattern for inspecting coarsely an alignment state in a second direction at a right angle to the first direction.

12 Claims, 7 Drawing Sheets

METHOD OF MANUFACTURING A SEMICONDUCTOR DEVICE USING A MAIN VERNIER PATTERN FORMED AT A RIGHT ANGLE TO A SUBSIDIARY VERNIER PATTERN

BACKGROUND OF THE INVENTION

1. Field of the Invention

The present invention relates to a method of manufacturing a semiconductor device, and more particularly, to a process for inspecting whether a resist pattern is accurately aligned to a pattern formed beforehand.

2. Description of Related Art

Semiconductor devices are manufactured by repeating a sequence of process steps which comprises forming a film, for example, a metal film entirely on a substrate in which a pattern, for example, a pattern of a field oxide layer has been already formed, forming a photoresist film entirely on the metal film, carrying out UV exposure in which ultra-violet rays are selectively irradiated on the photoresist film through a mask, developing the photoresist film to form a photoresist pattern, inspecting an alignment of the photoresist pattern to the pattern of the field oxide layer formed beforehand, and etching selectively the metal film to form a metal electrode wiring using the photoresist pattern as a mask when the photoresist pattern is confirmed by the inspecting process to be accurately positioned, that is, accurately aligned to the pattern of the field oxide layer. On the other hand, when the alignment of the photoresist pattern is determined to be wrong by the inspecting process, that is, the alignment is out of a permissible range, the photoresist pattern is completely removed without etching the metal film to re-work from forming newly a photoresist film entirely. To inspect the alignment of the photoresist pattern to the pattern formed beforehand; the pattern of the field oxide layer, a so-called vernier pattern technology is useful, in which a plurality of first rectangular patterns, in this case, oxide patterns are formed with forming the field oxide layer pattern on a semiconductor substrate, in such a manner that the centers of the first patterns are spaced apart from each other at equal first distance in the widthwise direction thereof; a plurality of second rectangular patterns are formed of the photoresist film with forming the resist pattern for the metal wiring by the UV exposure through the mask, in such a manner that the centers of the second rectangular patterns are spaced apart from each other at equal second distances in the widthwise direction thereof, the second distance being different from the first distance by 0.1 μm, for example, and that the center of the center rectangular pattern among the second rectangular patterns just coincides with the center of the center rectangular pattern among the first rectangular patterns when the resist pattern for forming the metal wiring is just aligned to the pattern of the field oxide layer; and a worker visually examines through a microscope which pair of the first and second rectangular patterns coincide each other at their center. If the coinciding first and second patterns are second ones from their center ones, the resist pattern for forming the metal wiring can be confirmed to be shifted by 0.2 μm from the desired position relating to the field oxide layer. The principle of the vernier pattern technology is essentially the same as that of a vernier calipers.

The vernier pattern including the first and second rectangular patterns is formed on a periphery portion of a device section in which semiconductor elements, wirings, bonding pads, etc. are formed, or is formed outside the device section such as on a chip dividing region or a scribe region such that these rectangular patterns are arranged in a first direction (horizontal direction in the plan view) to examine the alignment state in the first direction. Further, to examine the alignment state in a second direction (vertical direction in the plan view) another vernier pattern is provided on another portion outside the device section such that these rectangular patterns are arranged in the second direction. On the other hand, to evaluate the resist pattern all over the device section correctly, particularly, in a large chip or large device section in recent tendency, the vernier pattern for inspecting in the first direction is favorably provided near a center part of the outside section in the first direction along one edge of the device section, and the vernier pattern for inspecting in the second direction is favorably provided near a center area of the outside section in the second direction along another edge of the device section. As a result, the vernier pattern for the first direction and the vernier pattern for the second direction are separated from each other at a large distance. Therefore, when the alignment inspection in the first direction is conducted by a microscope, any vernier pattern for the second direction cannot be looked in the visual field of the microscope. In consequence, the time required for the step of checking the amount of resulting misalignment is increased in the manufacturing process, thus causing lowering in the processing capacity of the production line.

SUMMARY OF THE INVENTION

Accordingly, an object of the present invention is to provide a method of manufacturing a semiconductor device in which the inspection of the alignment state can be effectively conducted.

According to one feature of the present invention, there is provided a method of manufacturing a semiconductor device having a semiconductor substrate, the substrate including a device section having a first boundary line extending in a first direction and a first peripheral section outside the first boundary line of the device section. The method comprises the steps of: forming a first device pattern on the device section and a first check pattern on the peripheral section, simultaneously, the first check pattern comprising a first main pattern which includes a first number of rectangular patterns such that their centers are equally spaced apart from each other by a first distance in the widthwise direction and arranged in the first direction, and a first subsidiary pattern which includes a second number of rectangular patterns less than the first number such that their centers are equally spaced apart from each other by a second distance in the widthwise direction and arranged in a second direction at a right angle to the first direction; forming a film entirely on the substrate; forming a resist layer entirely on the film; forming a second device pattern of the resist layer on the film and on the device section and a second check pattern of the resist layer on the film and on the peripheral section, simultaneously by selective irradiation of rays on the resist layer followed by a development of the resist layer, the second check pattern comprising a second main pattern which includes the first number of rectangular patterns such that their center are equally spaced apart from each other by a third distance different from the first distance in the widthwise and arranged in the first direction, every rectangular pattern of the second main pattern being formed on or positioned near every the rectangular pattern of the first main pattern to form the first number of pairs by every rectangular pattern of the first main pattern and every rectangular pattern of the second main pattern, and a second subsidiary pattern which includes the second number of rectangular patterns such that their centers are equally spaced apart from each other by a fourth distance different from the second distance in the widthwise and arranged in the second direction, every rectangular pattern of the second subsidiary pattern being formed on or positioned near every rectangular pattern of the first subsidiary pattern to form the second number of pairs by every rectangular pattern of the first subsidiary pattern and every rectangular pattern of the second subsidiary pattern; and inspecting relative positions between the first and second main patterns in every pair thereof, and between the subsidiary first and second patterns in every pair thereof. The device section may have a second boundary line which extends in the second direction, and a second peripheral section is provided outside the second boundary line; a check pattern may be formed on the second peripheral section in the step of forming the first device pattern on the device section, the check pattern having a same figure as the first check pattern but its main pattern being arranged in the second direction and its subsidiary pattern being arranged in the first direction; and a check pattern of the resist layer may be formed on the second peripheral section in the step of forming a second device pattern of the resist layer on the device section, the check pattern having a same figure as the second check pattern but its main pattern being arranged in the second direction and its subsidiary pattern being arranged in the first direction. When the first and second distances are equal each other, and the third and fourth distances are less than the first and second distances, respectively, the fourth distance is less than the third distance. If the first number of the first and third rectangular patterns for forming a main vernier pattern is nine; the second number of the second and fourth rectangular patterns for forming a subsidiary vernier pattern is five; the first distance is 10.0 $\mu$m; the second distance is 10.0 $\mu$m; the third distance is 9.9 $\mu$m and the fourth distance is 9.8 $\mu$m, in this case, the main vernier pattern has capability of detecting a misalignment in the first direction with an accuracy of 0.1 $\mu$m, from $-0.4$ $\mu$m to $+0.4$ $\mu$m, and the subsidiary vernier pattern is capable of detecting a misalignment in the second direction with an accuracy of 0.2 $\mu$m, from "0.4 $\mu$m to $+0.4$ $\mu$m.

According to the present invention, a subsidiary vernier pattern is provided in the vicinity of a main vernier pattern, the subsidiary vernier pattern being coarser and lower in terms of resolution capability than the main vernier pattern, and this combination of main and subsidiary verniers is provided for each of the two detection purposes, that is, the detection of a misalignment in a first direction and the detection of a misalignment in a second direction. Therefore, misalignments in the two orthogonal directions can be detected within one field of view of a microscope in such a manner that, for one direction, the misalignment detection can be effected with such a degree of accuracy that the detected amount of misalignment can be fed back to an alignment device of a step-and-repeat apparatus, and, for the other direction, the detection can be effected with such a degree of accuracy that it is possible to judge whether the product is good or bad. Further, the main vernier pattern is different in size from the subsidiary vernier pattern there is no fear that the two verniers will be mistaken from each other. In addition, since the subsidiary vernier pattern may be coarse, the size thereof can be reduced, and therefore, the space required to install it can be minimized. For example, the subsidiary vernier pattern can be formed with the main vernier pattern in one chip dividing region, or one scribe region which extends along one edge line of the device section.

According to another aspect of the present invention, there is provided a semiconductor device which comprises a semiconductor substrate, the substrate including a device section delineated by a first boundary line extending in a first direction and a second boundary line extending in a second direction at a right angle to the first direction, and first and second peripheral sections positioned outside the first and second boundary lines, respectively; a first device pattern made of a first material and formed on the device section; a second device pattern made of a second material and formed on the first device pattern and on the device section; a first main vernier pattern formed on the first peripheral section and extending in the first direction by a distance along the first boundary line, the first main vernier pattern including a first pattern made of the first material and a second pattern made of the second material and formed on the first pattern; a first subsidiary vernier pattern formed on the first peripheral section near the first main vernier pattern and extending in the second direction by a distance shorter than the distance of the first main vernier pattern, the first subsidiary vernier pattern including a first pattern made of the first material and a second pattern made of the second material and formed on the first pattern; a second main vernier pattern formed on the second peripheral section and extending in the second direction by a distance along the second boundary line, the second main vernier pattern including a first pattern made of the first material and a second pattern made of the second material and formed on the first pattern; and a second subsidiary vernier pattern formed on the second peripheral section near the second main vernier pattern and extending in the first direction by a distance shorter than the distance of the second main vernier pattern, the second subsidiary vernier pattern including a first pattern made of the first material and a second pattern made of the second material and formed on the first pattern. The first material may be an insulating material such as silicon oxide or silicon nitride, and the second material may be a conductive material such as polycrystalline silicon aluminum, refractory metal (high melting point metal) (W, Mo, Ta, Ti) or alloy thereof.

According to the feature of the present invention, the confirmation of the alignment between the first and second device patterns can be easily conducted with respect to both first and second directions (X- and Y-directions) by inspecting only first or second main vernier pattern through a microscope, because, for example, when the first main vernier pattern is inspected the first subsidiary vernier pattern can be inspected within the same visual scope, and only when a fine inspection on the second direction is necessary, the second main vernier pattern is inspected by moving relatively a visual scope.

BRIEF DESCRIPTION OF THE DRAWINGS

FIGS. 5 to 9 are drawings showing process steps of the embodiment of the present invention, in which

DESCRIPTION OF A PRIOR ART

Figure 1:
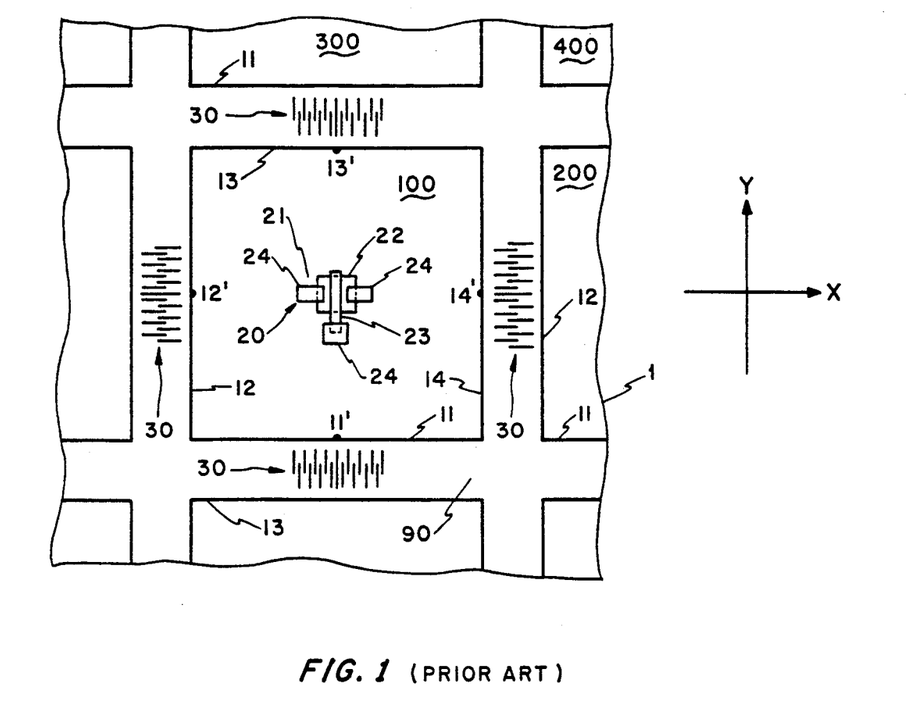
FIG. 1 is a plan view showing a semiconductor device manufactured by a conventional method.
Figure 2:
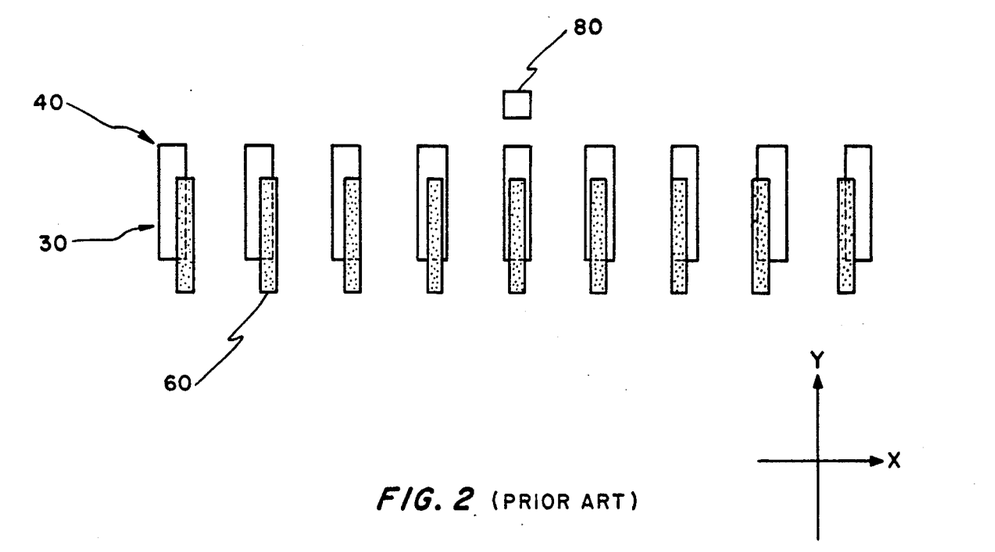
FIG. 2 is an enlarged plan view showing a portion of FIG. 1.

Referring to FIG. 1, a plurality of device sections 100 to 400 are formed on a silicon substrate (semiconductor wafer) 1, and each of the device sections is surrounded by peripheral sections of the substrate constituting a chip dividing region (scribe region) 90 of grid-like shape with first to fourth boundary lines 11 to 14; the first and third lines 11 and 13 extend in an X-direction and the second and fourth lines 12 and 14 extend in a Y-direction at a right angle to the X-direction. A plurality of active and passive elements, electrode wirings, bonding pads, etc. are formed in the device section. However, only one transistor 20 is exemplified. The transistor 20 includes source, drain and channel regions formed in an active region 22 surrounded by a thick field silicon oxide layer 21, a gate electrode 23 of polycrystalline silicon (hereinafter called as polysilicon) formed on the channel region via a gate insulating film and metallic wirings 24 connected to the source and drain regions and to the gate electrode, respectively. On the other hand, on the chip dividing section 90, vernier patterns 30 are formed along the boundary lines 11 to 14 near their centers 11' to 14'. Referring to FIG. 2, each of the vernier patterns 30 comprises a first check pattern 40 including nine rectangular patterns arranged in the X-direction (or Y-direction) and their centers in the width are spaced apart from each other at equal distance of 10.0 μm, a second check pattern 60 including nine rectangular patterns arranged in the X-direction (or Y-direction) and their centers in the width are spaced apart from each other at equal distance of 9.9 μm, and an indicium pattern 80 indicating the center pair of the rectangular patterns. The first check pattern 40 and the indicium pattern 80 are formed with the formation of the field oxide layer 21 in the device section, and the second check pattern 60 is formed with the formation of the gate electrode 23. Therefore, for example, if the rectangular patterns of the first and second check patterns coincide their centers at the center pair as shown in FIG. 2, the gate electrode 23 is confirmed to be aligned to the field insulating layer pattern 21, that is, to the active region 22. To the contrary, if their centers coincide at third pair from the center pair, one can recognize that the gate electrode 23 is shifted from the precise position by 0.3 μm in the X-direction (or Y-direction).

DETAILED DESCRIPTION OF THE EMBODIMENT

Figure 3:
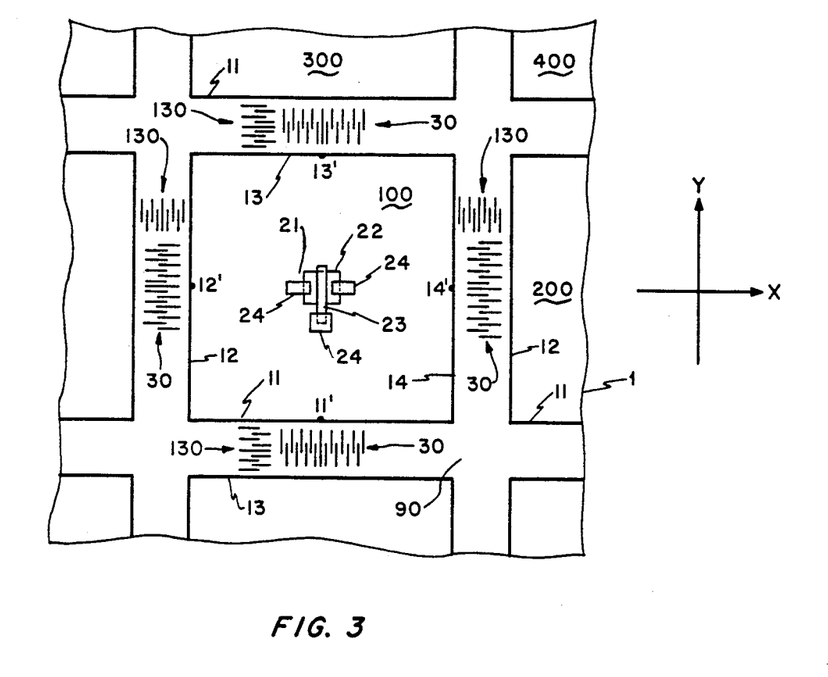
FIG. 3 is a plan view showing a semiconductor device manufactured by a method of an embodiment of the present invention.
Figure 4:
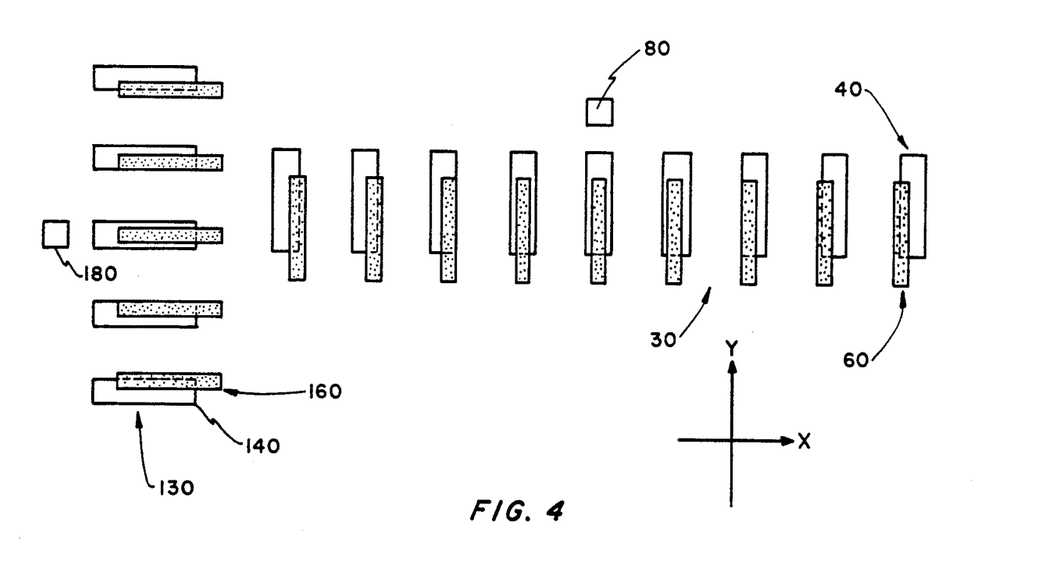
FIG. 4 is an enlarged plan view showing a portion of FIG. 3.

Referring to FIGS. 3 and 4, the same components as those in FIGS. 1 and 2 are indicated by the same reference numerals. Adding to the main vernier pattern 30, a subsidiary vernier pattern 130 is formed near the main vernier pattern 30. The subsidiary vernier pattern 130 comprises a first subsidiary pattern 140 including five rectangular patterns arranged in the Y-direction (or X-direction) and their centers in the width are spaced apart from each other at equal distance of 10.0 μm, a second subsidiary pattern 160 including five rectangular patterns arranged in the Y-direction (or X-direction) and their centers in the width are spaced apart from each at equal distance of 9.8 μm, and an indicium pattern 180 indicating the center pair of the rectangular patterns. The first subsidiary pattern 140 and the indicium pattern 180 of the subsidiary vernier pattern 130 are formed with the formation of the field oxide layer 21 in the device section and with the first main pattern 40 and the indicium pattern 80 of the main vernier pattern 30, and the second subsidiary pattern 160 of the subsidiary vernier pattern 130 is formed with the formation of the gate electrode 23 and with the second main pattern 60 of the main vernier pattern 30. Therefore, in addition to the fine checking of the alignment in the X-direction (or Y-direction) by the main vernier pattern 30, a coarser checking of the alignment in the Y-direction (or X-direction) by the subsidiary vernier pattern 130 can be conducted when the fine checking by the main vernier pattern 30 is conducted, within the same visual scope of a microscope. That is, for example, if the rectangular patterns of the first and second subsidiary patterns 140, 160 coincide their centers at the center pair as shown in FIG. 4, the gate electrode 23 is aligned to the field insulating layer pattern 21, that is, to the active region 22 in the Y-direction (or X-direction). To the contrary, if their centers coincide at second pair (end pair) from the center pair, one can recognize that the gate electrodd 23 is shifted from the precise position by 0.4 μm in the Y-direction (or X-direction). It is to be noted that the explanations are under an assumption that when the patterns in the device section are accurately aligned from each other in X- and Y-directions, the rectangular patterns coincide their centers at the center pair indicated by the indicium pattern 80 in the main vernier 30 and the rectangular patterns coincide their centers at the center pair indicated by the indicium pattern 180 in the subsidiary vernier 130, respectively.

Next, a method of the embodiment will be explained by referring FIGS. 5 to 9.

Figure 5A:
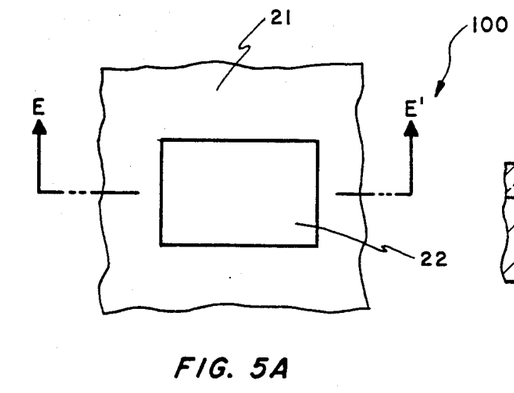
FIGS. 5A, 6A, 8A and 9A are plan views showing a device section of a substrate, and FIGS. 5A', 6A', 8A' and 9A' are cross-sectional views taken along lines E—E' in FIGS. 5A, 6A, 8A and 9A as viewed in the direction of arrows, respectively.
Figure 5B:
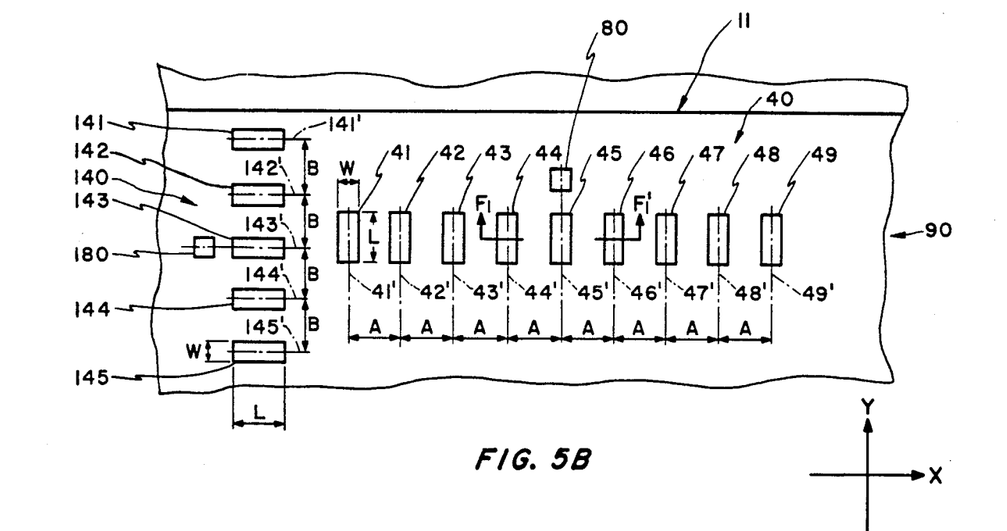
FIGS. 5B, 6B, 8B and 9B are plan views showing a peripheral section of the substrate, and FIGS. 5B', 6B', 8B' and 9B' are cross-sectional views taken along lines F—F' in FIGS. 5B, 6B, 8B and 9B as viewed in the direction of arrows, respectively.

At first, through a photo-lithography step using a mask and an oxidation step, the first main pattern 40, the main indicium pattern 80, the first subsidiary pattern 140 and subsidiary indicium pattern 180 are formed on the peripheral section 90 of the silicon substrate 1 by thick silicon oxide layer protruded from the major surface of substrate with the formation of the thick field silicon oxide layer 21 on the device section 100 surrounding the active region 22, and thereafter thin silicon oxide films 25, which is used as the gate insulating film under the gate electrode, are formed where the thick silicon oxide layers are absent. The first main pattern 40 is composed of first to ninth rectangular patterns 41 to 49 each having a width W of 2.0 μm and a length L of 15 μm. The patterns 41 to 49 are arranged in the X-direction and their centers 41' to 49' in the widthwise are spaced apart from each other at a distance of A of 10.0 μm. The first subsidiary check pattern 140 is composed of first to fifth rectangular patterns 141 to 145 each having a width W of 2.0 μm and a length L of 15 μm. The patterns 141 to 145 are arranged in the Y-direction and their centers 141' to 145' in the widthwise are spaced apart from each other at a distance B of 10.0 μm (FIG. 5).

Figure 6A:
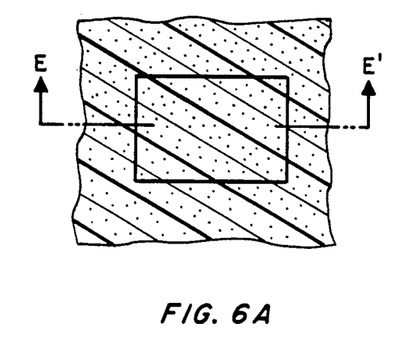
Figure 6B:
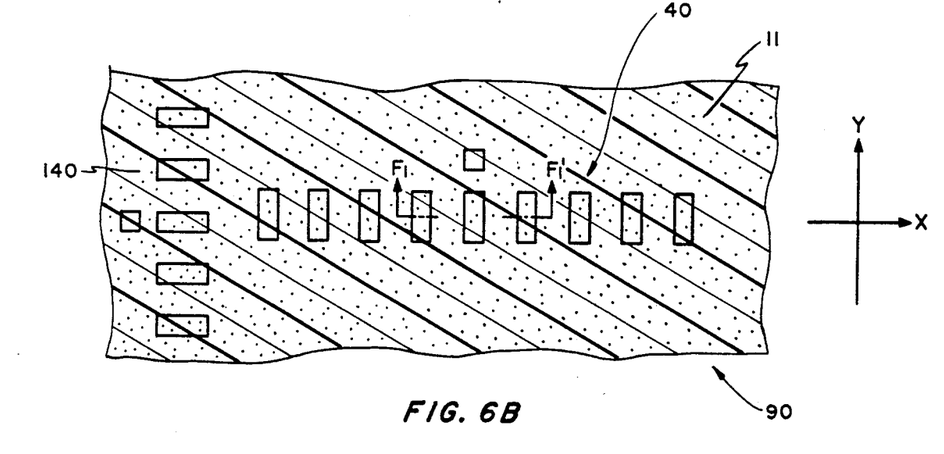

Next, a polysilicon film 27 is entirely formed, and a positive photo-resist layer 28 is entirely formed on the polysilicon film (FIG. 6).

Figure 7:
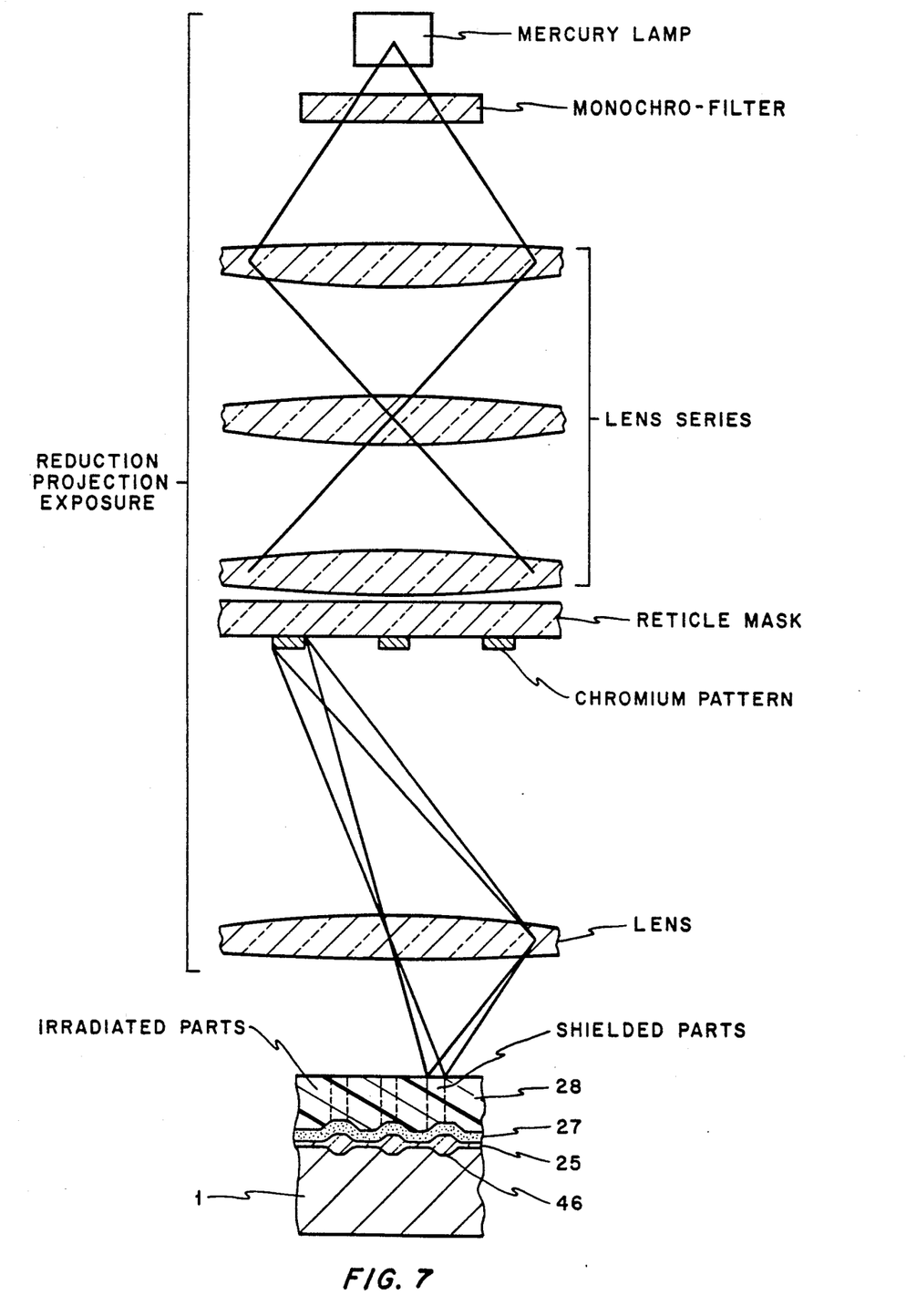
FIG. 7 is a cross-sectional view of the peripheral section of the substrate and a drawing schematically showing a reduction projection exposure in a step-and-repeat apparatus.

Next, as shown in FIG. 7, the resist layer 28 is selectively irradiated by ultra-violet (UV) rays through a reticle mask by a reduction projection exposure apparatus of a step-and-repeat system on the device section 100 and on the peripheral sections 90 to form necessary resist patterns on the device and peripheral sections after development. Returning to FIG. 3, in the step-and-repeat exposure, the resist layer on the peripheral section along the first and second boundary lines 11, 12 are irradiated with the resist layer on the device section 100 by one shot of the irradiation, and the resist layer on the peripheral section along the third and fourth boundary lines 13 and 14 are irradiated with device sections 300 and 200 by other shots of the irradiation after moving relatively the wafer, respectively.

Figure 8A:
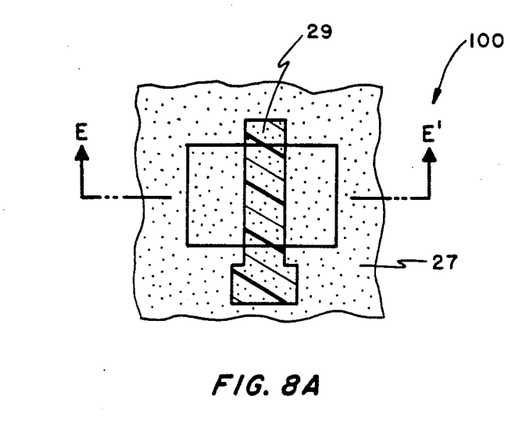
Figure 8B:
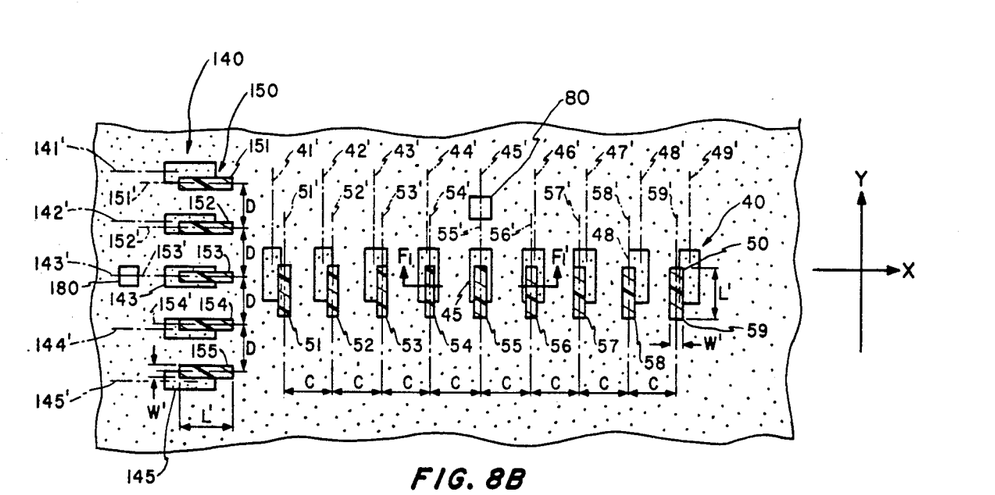

Next, by developing the positive photoresist layer which was selectively irradiated, a photo-resist pattern 29 by the resist layer 28 for forming the polysilicon gate electrode 23 is formed on the device section 100, and a second main pattern 50 by the resist layer 28 and a second subsidiary pattern 150 by the resist layer 28 are formed on the peripheral section 90. The second main pattern 50 is composed of first to ninth rectangular or stripe patterns 51 to 59 each having a width W' of 1.5 μm and a length L' of 15 μm. The pattern 51 to 59 are arranged in the X-direction and their centers 51' to 59' in the widthwise are spaced apart from each other at a distance C of 9.9 μm. Further, every rectangular pattern of the photo-resist layer belonging to the second main pattern 50 is formed partially on corresponding rectangular pattern of the protruded silicon oxide layer belonging to the first main pattern 40 to constitute nine paris of patterns of first and second main patterns. The subsidiary pattern 150 is composed of first to fifth rectangular or stripe patterns 151 to 155 each having a width W' of 1.5 μm and a length L' of 15 μm. The patterns 151 to 155 are arranged, in the Y-direction and their centers 151' to 159' in the widthwise are spaced apart from each other at a distance D of 9.8 μm. Further, every rectangular pattern of the photo-resist layer belonging to the second subsidiary pattern 150 is formed partially on corresponding rectangular pattern of the protruded silicon oxide layer belonging to the first subsidiary pattern 140 to constitute five pairs of patterns of first and second subsidiary patterns.

Thereafter, a worker inspects the main vernier pattern constituted of the first and second main patterns 40, 50 by a microscope with respect to what pair of the rectangular patterns coincide their centers. For example, if the resist pattern 55 and the oxide pattern 45 are observed to be coincided at their centers 55', 45' as shown in FIG. 8B, the resist pattern 24 for forming the gate electrode is precisely aligned, in the X-direction, to the insulating layer pattern 21, that is, to the active region pattern 22. To the contrary, if the resist pattern 58 and oxide pattern 48 would be observed to be coincided at their centers 58', 48', the resist pattern 24 is determined to be shifted from the precise position by 0.3 μm in the X-direction. According to the present invention, the subsidiary vernier pattern constituted of the first and second subsidiary patterns 140, 150 can be also inspected when the main vernier pattern is inspected within the same visual scope of the microscope. For example, if the resist pattern 153 and the oxide pattern 143 are observed to be coincided at their centers 153', 143' as shown in FIG. 8B, the resist pattern 24 for forming the gate electrode is aligned, in the Y-direction, to the insulating layer pattern 21, that is, to the active region pattern 22. To the contrary, if the resist pattern 155 and oxide pattern 145 would be observed to be coincided at their centers 155', 145', the resist pattern 24 is determined to be shifted from the precise position by 0.4 μm in the Y-direction.

Figure 9A:
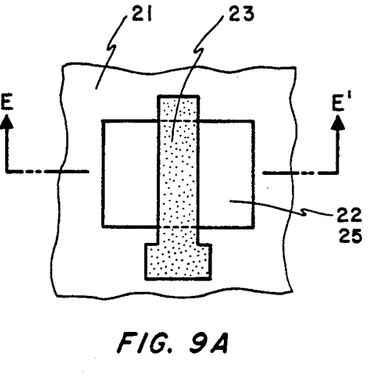
Figure 9B:
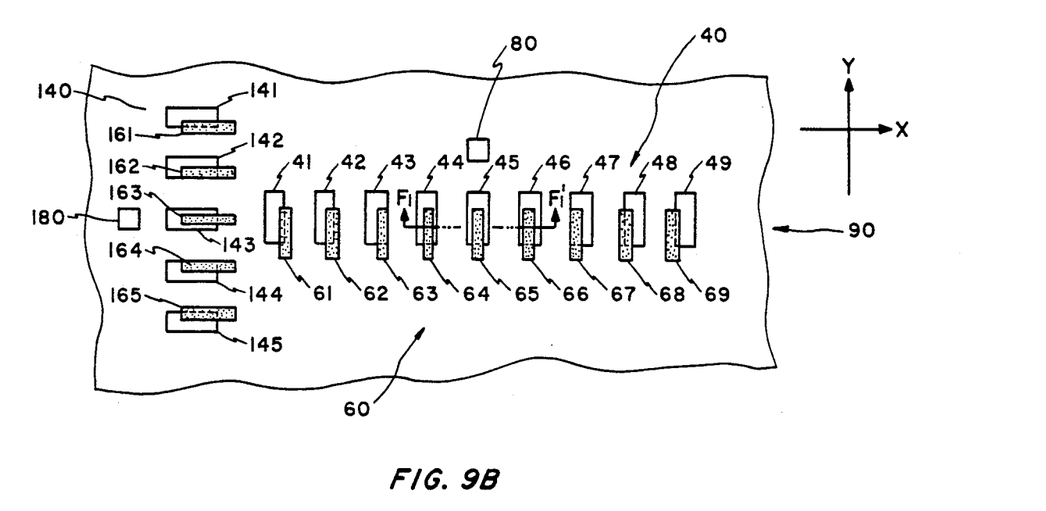

When the alignment of the resist pattern is within a permissible range in both of X and Y-directions, an etching process is carried out to remove selectively the polysilicon film 27 using the resist patterns as a mask so as to form the gate electrode 23 on the device section, and to form the main and subsidiary conductive patterns 60 and 160 composed of rectangular patterns 61 to 69 and 161 to 165, having the same shape and position as the resist patterns 51 to 59 and 151 to 155, respectively, on the peripheral section 90 (FIG. 9 and FIGS. 3, 4). On the other hand, when the alignment is out of the permissible range, the resist pattern is completely removed without etching the polysilicon film 27 to re-work from newly forming a resist film entirely.

What is claimed is:

1. A method of manufacturing a semiconductor device having a semiconductor substrate, said substrate including a device section having a first boundary line extending in a first direction and a first peripheral section outside said first boundary line of said device section.

said method comprising the steps of:

forming a first device pattern on said device section and a first check pattern and a first subsidiary pattern on said peripheral section, said first check pattern comprising a first main pattern which includes a first number of rectangular patterns positioned so that their centers are equidistant from each other by a first distance in the widthwise direction, said first main rectangular patterns being arranged in said first direction, and said first subsidiary pattern including a second number of rectangular pattern which are less than said first number, the centers of said second rectangular patterns being equidistant from each other by a second distance in the widthwise direction and being arranged in a second direction at a right angle to said first direction;

forming a film entirely over said substrate;

forming a resist layer entirely over said film and on said substrate;

forming a second device pattern and a second check pattern on said resist layer on said film, said patterns being formed on both said device section and said second check pattern of said resist layer over said film on said peripheral section, selectively irradiating the rays onto said resist layer followed by a development of said resist layer, said second check pattern comprising a second main pattern which includes said first number of rectangular patterns positioned so that their centers are equidistant from each other by a third distance which is different from said first distance in the widthwise direction and which is arranged in said first direction, each one of said rectangular patterns of said second main pattern being formed on or positioned near corresponding ones of said rectangular pattern of said first main pattern to form said first number of pairs of said rectangular patterns of said first main pattern and said rectangular patterns of said second main pattern, and a second subsidiary pattern including said second number of rectangular patterns positioned so that their centers are equally spaced from each other by a fourth distance which is different from said second distance in the widthwise direction, said fourth distance being arranged in said second direction, each one of said rectangular patterns of said second subsidiary pattern being formed on or positioned near corresponding ones of said rectangular patterns of said first subsidiary pattern to form said second member of pairs of said rectangular pattern of said first subsidiary pattern and said rectangular pattern of said second subsidiary pattern; and inspecting relative positions between said first and second main patterns in every said pair thereof, and between said first and second subsidiary patterns in every said pair thereof.

2. A method of manufacturing a semiconductor device of claim 1, in which said device section has a second boundary line which extends in said second direction, and a second peripheral section is provided outside said second boundary line; a check pattern being formed on said second peripheral section during said step of forming said first device pattern on said device section, said check pattern on said second peripheral section having a same figure as said first check pattern on said first peripheral section, the main pattern in said second peripheral section being arranged in said second direction and its subsidiary pattern being arranged in said first direction; and a check pattern of said resist layer being formed on said second peripheral section during said step of forming a second device pattern of said resist layer on said device section, said check pattern on said second peripheral section having a same figure as said second check pattern on said first peripheral section, the main pattern being arranged in said second direction and it subsidiary pattern being arranged in said first direction.

3. A method of manufacturing a semiconductor device of claim 1, in which said fourth distance is less than said third distance, and said first and second distance are equal each other.

4. A method of manufacturing a semiconductor device of claim 1, in which said third distance is less than said first distance, and said fourth distance is less than said second distance.

5. A method of manufacturing a semiconductor device of claim 1 further comprising a step of selectively removing said film by using said second device pattern of said resist layer and said second check pattern of said resist layer as a mask, when said second device pattern is determined by said inspecting step to be aligned to said first device pattern within a permissible range.

6. A method of manufacturing a semiconductor device of claim 1 further comprising a step of removing said second device pattern of said resist layer and said second check pattern of said resist layer without removing said film to re-work by forming a new resist layer, when the alignment of said second device pattern to said first device pattern is determined to be out of a permissible range by said inspecting step.

7. A method of manufacturing a semiconductor device of claim 1, in which said first device pattern is a field oxide layer pattern protruding from a major surface of said substrate, and said first check pattern is made of an oxide layer protruding from said major surface as said field oxide layer.

8. A method of manufacturing a semiconductor device of claim 7, in which said film is an electrically conductive film to form an electrode wiring on said device section.

9. A method of manufacturing a semiconductor device of claim 1, in which said peripheral section is a chip dividing region.

10. A method of manufacturing semiconductor substrates by a use of successive masks which must be aligned, said masks being divided into a plurality of device sections by an orthogonal array of boundary ares, said method comprising the steps of:
(a) simultaneously forming patterns in both said device sections and said boundary areas by a first used mask, whereby said patterns in said device sections and in said boundary areas are perfectly positioned with respect to each other so that said patterns in said boundary areas may be used to align later used masks during construction of electronic devices in said device sections,
(b) forming said patterns in said boundary areas as a pair of vernier scales oriented at right angles with respect to each other, and
(c) forming said pair of vernier scales close enough to each other to be positioned within a single field of vision of a microscope used to view mask alignments during said construction of said device.

11. The method of manufacturing semiconductor substrate of claim 10 and the added steps of:
(d) forming one of said vernier scaled in each boundary area parallel to the direction of the orthogonal boundary on which it is formed, and
(e) forming the other of said vernier scales in the boundary perpendicular to said direction.

12. The method of manufacturing semiconductor substrate of claim 11 wherein said one vernier scale has fine graduations and said other vernier scale has course graduations.

* * * * *